(12) United States Patent
McWilliams (10) Patent No.: US 6,980,041 B2
(45) Date of Patent: Dec. 27, 2005

(54) NON-ITERATIVE INTRODUCTION OF PHASE DELAY INTO SIGNAL WITHOUT FEEDBACK

(75) Inventor: John L. McWilliams, Vancouver, WA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 35 days.

(21) Appl. No.: 10/264,815

(22) Filed: Oct. 4, 2002

(65) Prior Publication Data

US 2004/0066222 A1   Apr. 8, 2004

(51) Int. Cl.[7] .............................................. H03H 11/26
(52) U.S. Cl. ...................................... 327/277; 327/278
(58) Field of Search ................................ 327/141–163, 327/276–279, 280–290

(56) References Cited

U.S. PATENT DOCUMENTS

| | | | | |
|---|---|---|---|---|
| 4,922,141 A | * | 5/1990 | Lofgren et al. ............. 327/158 |
| 5,212,716 A | | 5/1993 | Ferraiolo et al. ........... 375/119 |
| 5,231,319 A | * | 7/1993 | Crafts et al. ................. 327/277 |
| 5,245,231 A | * | 9/1993 | Kocis et al. ................. 327/277 |
| 5,355,037 A | * | 10/1994 | Andresen et al. ........... 327/158 |
| 5,438,353 A | | 8/1995 | Morrison .................... 347/250 |
| 5,463,337 A | | 10/1995 | Leonowich .................. 327/158 |
| 5,465,065 A | * | 11/1995 | Stevens ....................... 327/276 |
| 5,477,330 A | | 12/1995 | Dorr ............................ 358/296 |
| 5,550,514 A | * | 8/1996 | Liedberg ..................... 331/1 A |
| 5,708,382 A | * | 1/1998 | Park ............................. 327/277 |
| 5,760,816 A | | 6/1998 | Morrison .................... 347/247 |
| 5,793,709 A | | 8/1998 | Carley ......................... 368/113 |
| 5,940,608 A | | 8/1999 | Manning ..................... 395/558 |
| 5,945,862 A | | 8/1999 | Donnelly et al. ........... 327/278 |
| 5,946,268 A | * | 8/1999 | Iwamoto et al. ............ 365/233 |
| 5,949,260 A | | 9/1999 | Toda |
| 5,990,923 A | | 11/1999 | Morrison .................... 347/252 |
| 6,025,745 A | * | 2/2000 | Lee et al. .................... 327/277 |
| 6,034,558 A | * | 3/2000 | Vanderschoot et al. ..... 327/277 |
| 6,052,011 A | | 4/2000 | Dasgupta ..................... 327/270 |
| 6,104,224 A | * | 8/2000 | Koshikawa .................. 327/277 |
| 6,335,751 B1 | | 1/2001 | Morrison ..................... 347/235 |
| 6,215,343 B1 | | 4/2001 | Birru ........................... 327/158 |
| 6,232,812 B1 | | 5/2001 | Lee .............................. 327/277 |
| 6,236,427 B1 | | 5/2001 | Roylance et al. ........... 347/249 |
| 6,255,880 B1 | * | 7/2001 | Nguyen ....................... 327/277 |
| 6,259,294 B1 | * | 7/2001 | Murakami et al. .......... 327/277 |
| 6,259,467 B1 | | 7/2001 | Hanna ......................... 347/249 |
| 6,289,068 B1 | | 9/2001 | Hassoun et al. ............ 375/376 |
| 6,340,986 B1 | | 1/2002 | Morrison et al. ........... 347/249 |
| 6,366,307 B1 | | 4/2002 | Morrison .................... 347/249 |
| 6,390,579 B1 | | 5/2002 | Roylance et al. .............. 347/9 |
| 6,459,319 B2 | * | 10/2002 | Sako .......................... 327/276 |
| 6,573,776 B2 | | 6/2003 | Miyamoto |
| 6,593,791 B1 | * | 7/2003 | Weintraub ................... 327/262 |
| 6,597,213 B1 | * | 7/2003 | Weintraub ................... 327/122 |

(Continued)

FOREIGN PATENT DOCUMENTS

GB          2 346 275        8/2000        ........... H03L 7/081

(Continued)

Primary Examiner—Terry D. Cunningham (57) ABSTRACT

Non-iterative introduction of phase delay into a signal, without feedback, is disclosed. A system of one embodiment of the invention includes a controller and a mechanism. The controller provides a pulse having a length representative of a phase delay for introduction into a signal. The mechanism non-iteratively introduces the phase delay into the signal based on the pulse, without feedback.

14 Claims, 5 Drawing Sheets

U.S. PATENT DOCUMENTS

2001/0033630 A1    10/2001    Hassoun et al. ............. 375/376
2002/0008556 A1 *  1/2002     Manning ..................... 327/158
2003/0001650 A1 *  1/2003     Cao et al. ..................... 327/277
2003/0011417 A1 *  1/2003     Chung et al. ................ 327/277

FOREIGN PATENT DOCUMENTS

WO    WO 87/01534    3/1987    ............. H03L 7/06
WO    WO 99/67882    12/1999   ........... H03L 7/081

* cited by examiner

NON-ITERATIVE INTRODUCTION OF PHASE DELAY INTO SIGNAL WITHOUT FEEDBACK

BACKGROUND

In electronic circuits, a phase delay is often introduced into a signal, for any of a variety of reasons. As one example, to ensure that two signals are synchronized with one another, a phase delay may be introduced into one of the signals. Phase delays may be introduced into signals for other reasons as well.

A circuit to introduce a phase delay into a signal may utilize an iterative approach. For instance, if a given delay circuit is capable of introducing an additional one-nanosecond delay into a given signal each time it is called, the delay circuit is called upon to update its delay a number of times in order to introduce the desired delay. As an example, if a five-nanosecond delay is desired, then the circuit may be called upon five times before the correct delay is achieved.

However, iterative approaches may have to be called a number of times to introduce the desired delay into a signal. Because of their iterative nature, for instance, these approaches are relatively slow in performance.

SUMMARY OF THE INVENTION

The invention can be embodied in a system including a controller and a mechanism. The controller provides a pulse having a length representative of a phase delay for introduction into a signal. The mechanism non-iteratively introduces the phase delay into the signal based on the pulse, without feedback.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

System and Overview

Figure 1:
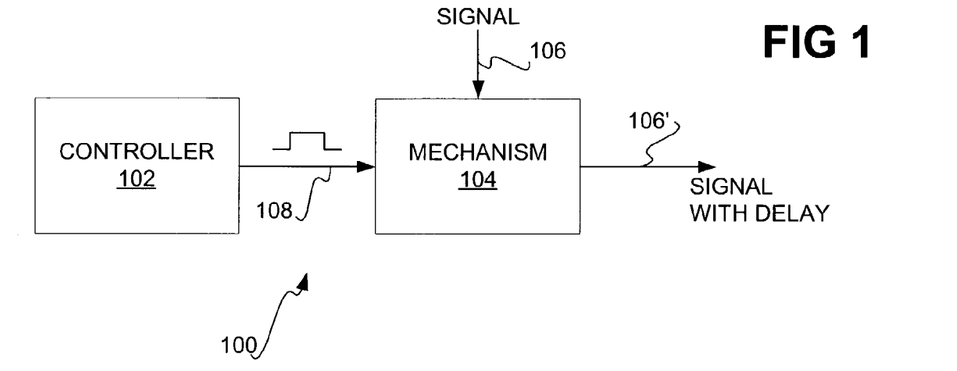
FIG. 1 is a diagram of a system according to an embodiment of the invention.

FIG. 1 shows a system 100 according to an embodiment of the invention. The system 100 includes a controller 102 and a mechanism 104. Each of the controller 102 and the mechanism 104 can be implemented as hardware, software, or a combination of hardware and software. Each of the controller 102 and the mechanism 104 can be considered as the means for performing its respective functionality. The controller 102 provides a pulse 108 indicative of a desired phase delay to be introduced into the signal 106. The pulse 108 in one embodiment has a length proportional to the desired phase delay. The mechanism 104, based on the pulse 108 from the controller 102, introduces the desired phase delay into the signal 106, resulting in the delayed signal 106'. The controller 102 may provide other inputs to the mechanism 104 besides the pulse 108 that is shown in FIG. 1. In one embodiment the controller 102 is part of the mechanism 104. In another embodiment, the controller 102 is part of a system other than the system 100.

Figure 2A:
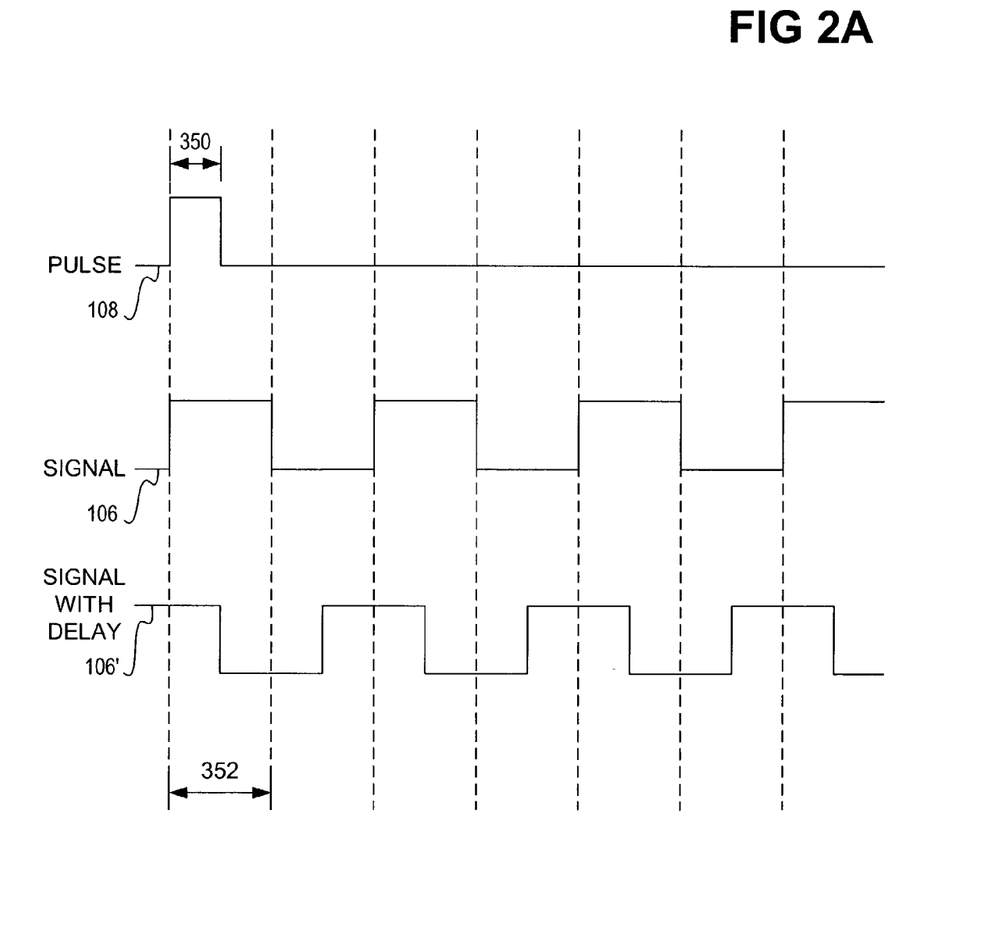
FIGS. 2A, 2B, and 2C are timing diagrams showing how pulses of different lengths introduce different phase delays into signals, according to an embodiment of the invention.
Figure 2B:
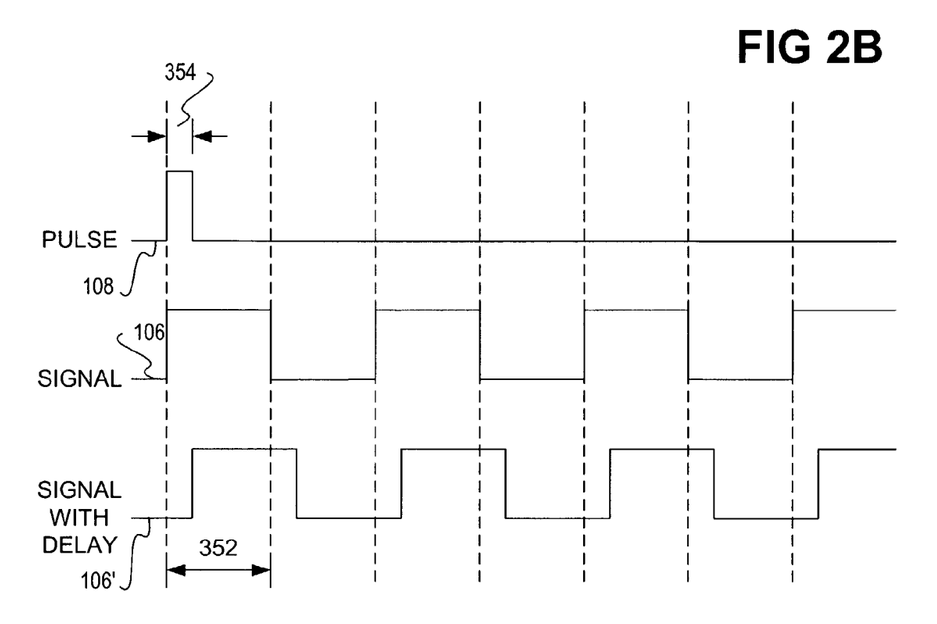
Figure 2C:
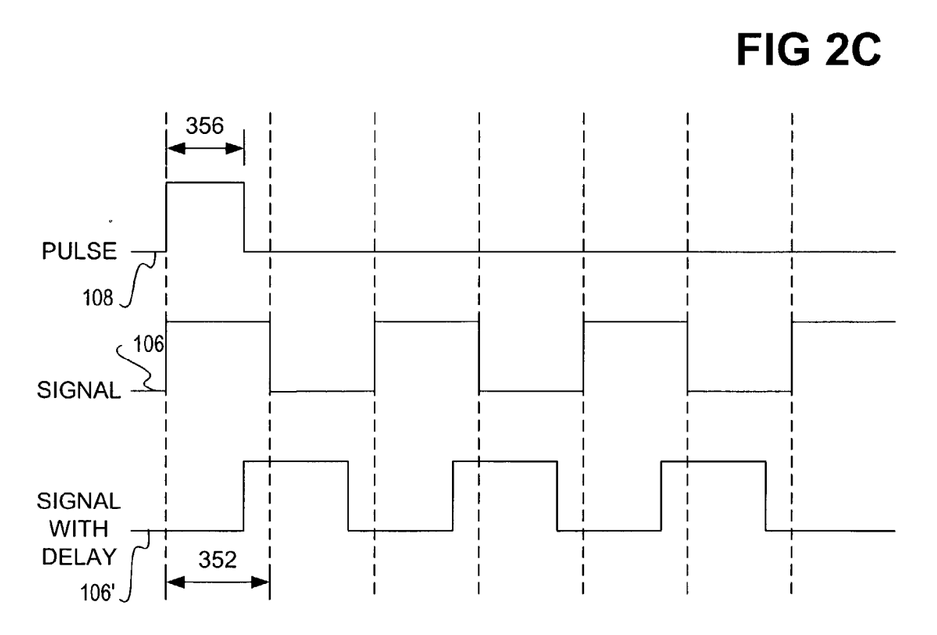

FIGS. 2A, 2B, and 2C are timing diagrams showing examples of how different lengths of the pulse 108 affect the phase delay introduced into the signal 106, according to varying embodiments of the invention. In FIG. 2A, the length 350 of the pulse 108 is one-half of the clock cycle length 352. This introduces a 180-degree phase delay into the signal 106, such that the delayed signal 106' is 180 degrees out of phase as compared to the signal 106. In FIG. 2B, the length 354 of the pulse 108 is one-quarter of the clock cycle length 352, introducing a 90-degree phase delay into the signal 106, such that the delayed signal 106' is 90 degrees out of phase relative to the signal 106.

In FIG. 2C, the length 356 of the pulse 108 is three-quarters of the clock cycle length 352, introducing a 270-degree phase delay into the signal 106, resulting in the delayed signal 106' being 270 degrees out of phase relative to the signal 106. In general, in one embodiment the proportion of the length of the pulse 108 relative to the clock cycle length 352 is the proportion of 360 degrees by which the signal 106 will be delayed, resulting in the delayed signal 106'. That is, the length of the pulse 108, divided by the length of the clock cycle 352, times 360 degrees is the of phase delay that is introduced into the signal 106, in one embodiment of the invention.

For example, the clock cycle length 352 may be twelve nanoseconds. Where the pulse 108 is six nanoseconds, the signal 106 is delayed by 180 degrees, or six nanoseconds in this example, becoming the delayed signal 106', and corresponding to the timing diagram of FIG. 2A. Where the pulse 108 is three nanoseconds, the signal 106 is delayed by 90 degrees, or three nanoseconds in this example, becoming the delayed signal 106', and corresponding to the timing diagram of FIG. 2B. Finally, where the pulse 108 is nine nanoseconds, the signal 106 is delayed by 270 degrees, or nine nanoseconds in this example, becoming the delayed signal 106', and corresponding to the timing diagram of FIG. 2C.

Figure 3A:
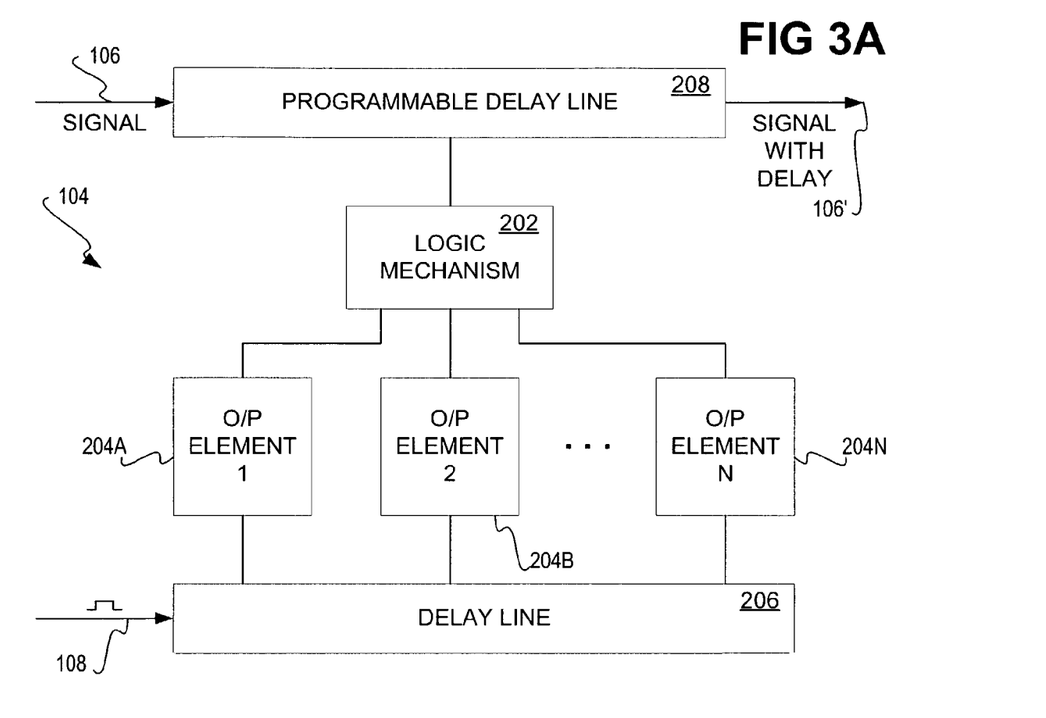
FIGS. 3A and 3B are diagrams of a mechanism to non-iteratively introduce a desired phase delay into a signal, without feedback, according to varying embodiments of the invention.
Figure 3B:
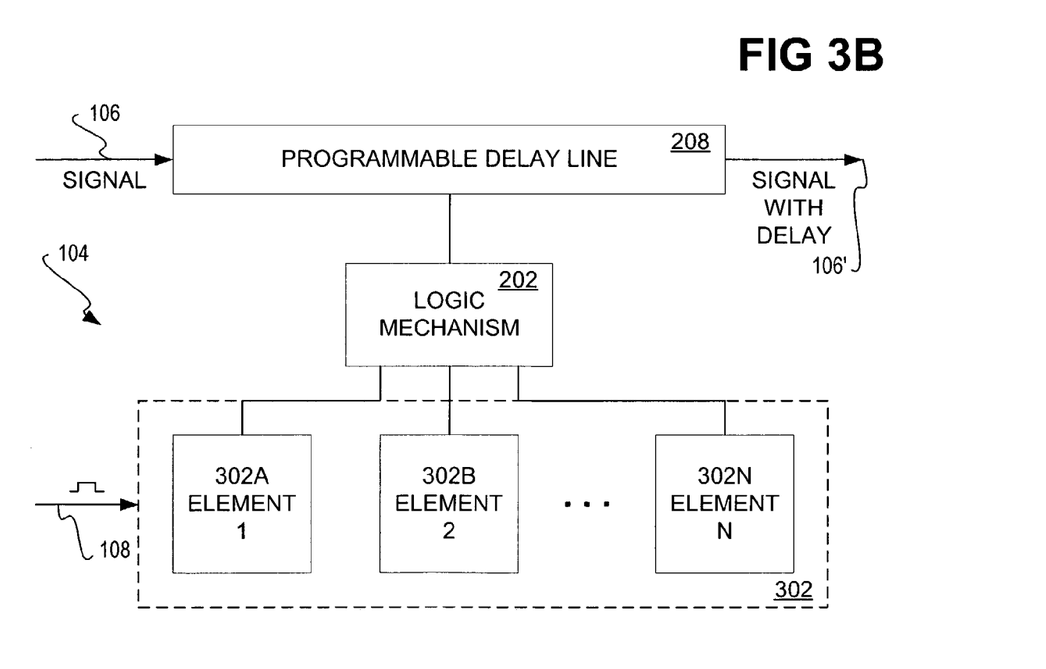

FIGS. 3A and 3B show differing embodiments for implementing the mechanism 104. In FIG. 3A, the mechanism 104 includes a delay line 206, a number of output elements 204A, 204B, ..., 204N, a logic mechanism 202, and a programmable delay line 208. Each of the components of FIG. 3A can be considered as the means for performing its respective functionality. The output elements 204A, 204B, ..., 204N are collectively referred to as the output elements 204. The delay line 206 sets at least some of the output elements 204 based on the pulse 108. The delay line 206 thus effectively measures the length of the pulse 108, where the length of the pulse 108 is proportional to the desired phase delay to be introduced into the signal 106. The delay line 206 sets at least some of the output elements 204 in proportional correspondence with the length of the pulse 108.

The logic mechanism 202 may be implemented as hardware, software, or a combination of hardware and software, as can be appreciated by those of ordinary skill within the art. The logic mechanism 202 counts the number of the output elements 204 that have been set by the delay line 206. In response, the logic mechanism 202 programs the programmable delay line 208 based on this counting. By passing through the programmable delay line 208 as has been so programmed by the logic mechanism 202, the signal 106 is delayed by the desired phase delay, resulting in the delayed signal 106'. The programmable delay line 208 may also be implemented as hardware, software, or a combination of hardware and software, as can be appreciated by those of ordinary skill within the art.

As an example, there may be twelve of the output elements 204. The length of the pulse 108 is a fraction of the clock cycle length 352 of FIGS. 2A–2C, where the clock cycle length 352 may be twelve nanoseconds in length. If the pulse 108 has a length of six nanoseconds, then the delay line 206 sets six of the output elements 204, which are counted by the logic mechanism 202 to program the programmable delay line 208 to delay the signal 106 by six nanoseconds, or 180 degrees, in the signal 106 becoming the delayed signal 106'. That is, the proportion of the length of the pulse 108 to the clock cycle length 352 is the proportion of the output elements 204 that the delay line 206 sets, and which the logic mechanism 202 counts to correspondingly program the programmable delay line 208.

The mechanism 104 of the embodiment of FIG. 3A is non-iterative. The pulse 108 results in the delay line 206 setting at least some of the output elements 204, which are counted by the logic mechanism 202 to program the programmable delay line 208. The logic mechanism 202 thus programs the programmable delay line 208 with the desired phase delay to be introduced into the signal 106. Once the signal 106 passes through the programmable delay line 208, the resulting signal 106' has the desired phase delay. No further modification of the delay of the signal 106' is needed to achieve the desired phase delay. That is, no iterative actions are taken to introduce the desired phase delay into the signal 106'.

The mechanism 104 of the embodiment of FIG. 3A also does not contain any feedback. After the pulse 108 results in the delay line 206 setting some of the output elements 204, the logic mechanism 202 counts the output elements 204 that have been set, and correspondingly programs the programmable delay line 208. That is, the mechanism 104 of the embodiment of FIG. 3A operates, as shown in FIG. 3A, in a bottom-up manner. After the delay line 206 has set the output elements 204, the delay line 206 does not receive any input from any component of the mechanism 104 upstream. Similarly, after the logic mechanism 202 has counted the output elements 204, and has set the programmable delay line 208, the logic mechanism 202 does not receive any input from any component of the mechanism 104 upstream. That is, no feedback exists within the mechanism 104 of the embodiment of FIG. 3A. No component provides input to another component from which it indirectly or directly receives input.

In FIG. 3B, the mechanism 104 includes elements 302, including the elements 303A, 303B, ..., 302N, as well as the logic mechanism 202 and the programmable delay line 208. Each of the components of FIG. 3B can be considered the means for performing its respective functionality. A number of the elements 302 are set based on the pulse 108. That is, a number of the elements 302 are set in proportional correspondence to the length of the pulse 108, where the length of the pulse 108 is proportional to the desired phase delay to be introduced into the signal 106. The logic mechanism 202 then counts the number of the elements 302 that have been set, and correspondingly programs the programmable delay line 208 based on this counting. By passing through the programmable delay line 208 as has been programmed, the signal 106 is delayed by the desired phase delay, resulting in the delayed signal 106'.

As an example, there may be nine of the elements 302. The length of the pulse 108 is a fraction of the clock cycle length 352 of FIGS. 2A–2C, where the clock cycle length 352 may be twelve nanoseconds in length. If the pulse 108 is four nanoseconds in length, then three of the elements 302 are set, which are counted by the logic mechanism 202 to program the programmable delay line 208 to delay the signal 106 by four nanoseconds, or 120 degrees, in the signal 106 becoming the delayed signal 106'. The proportion of the length of the pulse 108 to the clock cycle 352 is the proportion of the elements 302 that the pulse 108 sets, and which the logic mechanism 202 counts to correspondingly program the programmable delay line 208.

The mechanism 104 of the embodiment of FIG. 3B is non-iterative. The pulse 108 sets at least some of the elements 302, which are counted by the logic mechanism 202 to program the programmable delay line 208. The logic mechanism 202 thus programs the programmable delay line 208 with the desired phase delay to be introduced into the signal 106. Once the signal 106 passes through the programmable delay line 208, the resulting signal 106' has the desired phase delay. No further delay of the signal 106' is needed to achieve the desired phase delay. That is, no iterative actions are taken to introduce the desired phase delay into the signal 106'.

The mechanism 104 of the embodiment of FIG. 3B also does not contain any feedback. After the pulse 108 sets at least some of the output elements 302, the logic mechanism 202 counts the elements 302 that have been set, and correspondingly programs the programmable delay line 208. The mechanism 104 of the embodiment of FIG. 3B operates, as shown in FIG. 3B, in a bottom-up manner. For instance, after the logic mechanism 202 has counted the elements 302, and has set the programmable delay line 208, the logic mechanism 202 does not receive any input from any component of the mechanism 104 upstream. No feedback exists within the mechanism 104 of the embodiment of FIG. 3B. That is, no component provides input to another component from which it indirectly or directly receives input.

Circuit of Specific Embodiment

Figure 4:
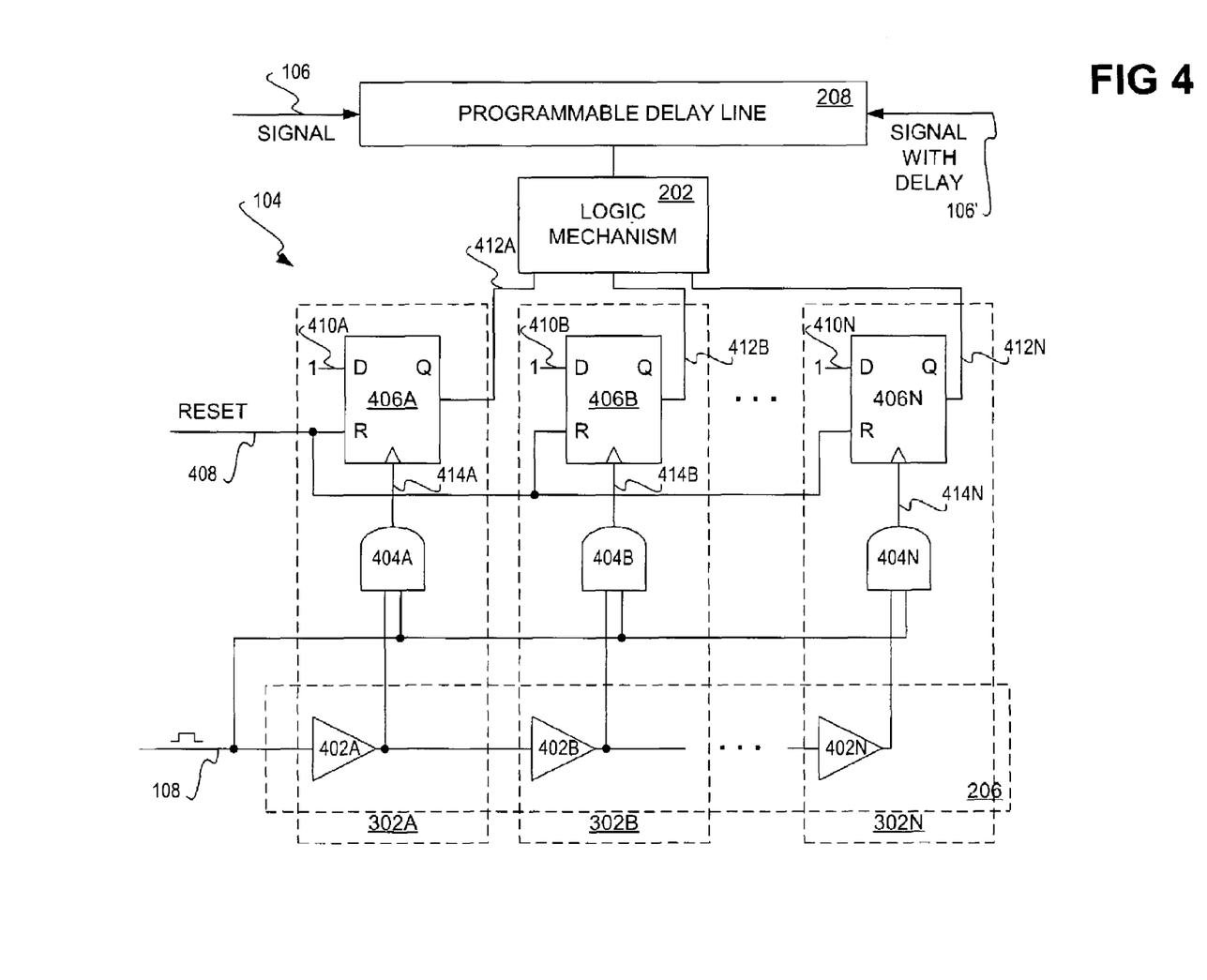
FIG. 4 is a circuit diagram of a mechanism to non-iteratively introduce a desired phase delay into a signal, without feedback, according to an embodiment of the invention.

FIG. 4 shows a more detailed implementation of the mechanism 104, according to an embodiment of the invention. The mechanism 104 of the embodiment of FIG. 4 is consistent with the mechanism 104 of each of the embodiments of FIGS. 3A and 3B. The mechanism 104 of the embodiment of FIG. 4 includes a number of delay elements 402A, 402B, . . . , 402N, collectively referred to as the delay elements 402, a number of AND gates 404A, 404B, . . . , 404N, collectively referred to as the AND gates 404, and a number of flip-flops 406A, 406B, . . . 406N, collectively referred to as the flip-flops 406. The mechanism 104 also includes the logic mechanism 202 and the programmable delay line 208.

Each of the components of FIG. 4 can be considered the means for performing its respective functionality. Furthermore, the delay line 206 of FIG. 3A can be considered in one embodiment to include the delay elements 402, as shown in FIG. 4, and the output elements 204 of FIG. 3A can be considered to include the flip-flops 406 and/or the AND gates 404. The elements 302 of FIG. 3B can be considered in one embodiment to include the delay elements 402, the AND gates 404, and/or the flip-flops 406, as is shown in FIG. 4.

The pulse 108 propagates through the delay elements 402. Each of the delay elements 402 delays the pulse 108 from reaching a successive one of the delay elements 402 by a predetermined length of time. In one embodiment, the delay elements 402 are combinatorial logic devices, or are analog devices. The output of each of the delay elements 402, as well as the pulse 108, serve as the inputs to the AND gates 404. Each of the AND gates 404 thus output a logic one only when both of its inputs are high. For example, if the pulse 108 has a length of five nanoseconds, and each of the delay elements 402 represents a delay of one nanosecond, five of the AND gates 404 will output logic ones.

This is because the pulse 108 is asserted on one of the inputs of each of the AND gates 404 for five nanoseconds, and just the first five of the delay elements 402 will assert inputs of their corresponding gates of the AND gates 404 during these five nanoseconds. With respect to each of the other of the AND gates 404, for the first five nanoseconds one of the inputs will be high resulting from the pulse 108, but the other of the inputs will be low, because the pulse 108 has not yet propagated through its corresponding one of the delay elements 402. Some time after the first five nanoseconds, another of the inputs of each of the other of the AND gates 404 will be high for five nanoseconds, resulting from the pulse 108 propagating through a corresponding one of the delay elements 402. However, at that point the other inputs to the AND gates 404 resulting from the pulse 108 will already be low.

The reset line 408 is asserted and then deasserted prior to the pulse 108 being asserted, such as by the controller 102 of FIG. 1. The reset line 408 asynchronously resets the flip-flops 406 so that their outputs 412, which encompass the outputs 412A, 412B, . . . , 412N, are logic zeros unless changed. Logic ones are asserted on the inputs 410, which encompass the inputs 410A, 410B, . . . , 410N, of the flip-flops 406.

Thus, when the clock inputs 414, which encompass the clock inputs 414A, 414B, . . . , 414N, of the flip-flops 406 transition from low to high, the outputs 412 correspondingly switch to logic ones. If the clock inputs 414 do not transition from low to high, however, the outputs 412 of the flip-flops 406 remain at logic zeros. The outputs of the AND gates 404 in effect latch their corresponding flip-flops 406 when they transition from low to high. The flip-flops 406, in other words, indicate whether their corresponding AND gates 404 ever output logic ones, even after the AND gates 404 have reverted back to outputting logic zeros.

The logic mechanism 202 is then able to count the number of the flip-flops 406 that are outputting logic ones on their outputs 412. In response to this counting, the logic mechanism 202 correspondingly programs the programmable delay line 208. That is, the mechanism 202 programs the programmable delay line 208 based on the number of the flip-flops 406 that it has counted as outputting logic ones on their outputs 412. A greater or a lesser number of flip-flops 406 outputting logic ones results in the logic mechanism 202 programming the programmable delay line 208 with a greater or a lesser delay, respectively. This introduces a corresponding phase delay into the signal 106, resulting in the delayed signal 106'.

An example is illustrative in describing operation of the mechanism 104 of the embodiment of FIG. 4. There may be ten of the delay elements 402, ten of the AND gates 404, and ten of the flip-flops 406. The clock cycle length may be ten nanoseconds, the pulse 108 may be five nanoseconds in length, and each of the delay elements 402 may represent a one-nanosecond delay. The flip-flops 406 are reset via the reset line 408 before the pulse 108 is asserted.

During the five nanoseconds of the pulse 108, the first five of the delay elements 402 are able to propagate the pulse 108 such that the corresponding first five of the AND gates 404 have both their inputs high. For the last five of the AND gates 404, during the five nanoseconds of the pulse 108 only one of each of their inputs is high, due to the pulse 108. The other input of each of these last five of the AND gates 404 remains low during these five nanoseconds, because the pulse 108 has not yet propagated through the corresponding last five of the delay elements 402. After the five nanoseconds of the pulse 108, one of each of their inputs will then be low, due to the pulse 108 having expired.

Therefore, the first five of the AND gates 404 transition the clock inputs 414 of the corresponding first five of the flip-flops 406 from low to high. These first five of the flip-flops 406 latch their corresponding outputs 412 at logic ones, and the outputs 412 of these first five of the flip-flops 406 remain at logic ones even after the first five of the AND gates 404 no longer assert their corresponding clock inputs 414. This enables the logic mechanism 202 to have sufficient time to count the number of the flip-flops 406 that have their outputs 412 at logic ones. The logic mechanism 202 thus counts five of the flip-flops 406 as outputting logic ones, and may correspondingly program a five-nanosecond delay into the programmable delay line 208. The delay line 208 then delays the signal 106 by five nanoseconds, resulting in the delayed signal 106'.

As has been described, the flip-flops 406 are in one embodiment edge-triggered devices, meaning that they latch on the leading transition from low to high, or the lagging transition from high to low. However, in another embodiment, they may be level-triggered devices, meaning that they latch on a high input signal, and not on the transition from high to low or from low to high. Other types of devices are also amenable to embodiments of the invention.

Method

Figure 5:
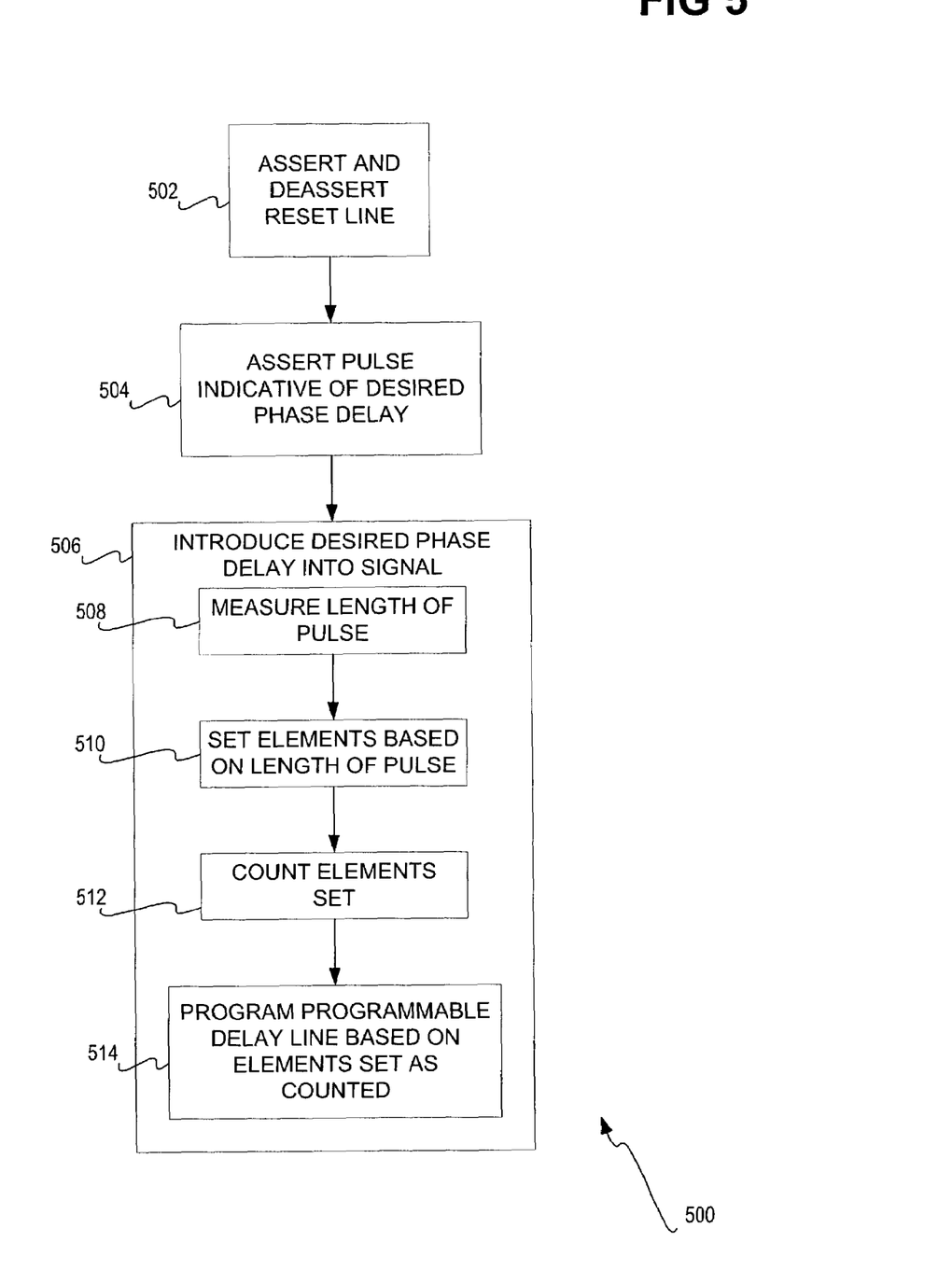
FIG. 5 is a flowchart of a method according to an embodiment of the invention.

FIG. 5 shows a method 500 according to an embodiment of the invention. The method 500 may be performed at least in part by the system 100 of FIG. 1 and/or the mechanism 104 of FIGS. 3A, 3B, and/or 4. First, a reset line, such as the reset line 408 of FIG. 4, is asserted and then deasserted as necessary (502), to asynchronously reset the flip-flops. Next, a pulse is asserted, where the pulse is indicative of a desired phase delay (504). The pulse may be the pulse 108 of FIGS. 1, 2A–2C, 3A–3B, and/or 4. Finally, the desired phase delay is introduced into a signal, based on the asserted pulse (506).

The signal may be the signal 106 of FIGS. 1, 2A–2C, 3A–3B, and/or 4, resulting in the delayed signal 106' of these same figures.

Introducing the desired phase delay into the signal can be accomplished as follows. First, the length of the pulse is measured (508). The length of the pulse may be measured, for instance, by the delay line 206 of FIG. 3A. Elements are then set based on the length of the pulse as measured (510). These elements may be the output elements 204 of FIG. 3A, the elements 302 of FIG. 3B, and/or the flip-flops 406 of FIG. 4. The elements that have been set are counted (512), such as by the logic mechanism 202 of FIGS. 1, 3A–3B, and/or 4. Finally, a programmable delay line is programmed based on the elements that have been set as counted (514), such as the programmable delay line 208 of FIGS. 1, 3A–3B, and/or 4.

Conclusion

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

I claim:

1. A system comprising:
   a controller to provide a pulse having a length proportional to a phase delay for introduction into a signal; and,
   a mechanism to introduce the phase delay into the signal by programming a programmable delay line of the mechanism based on the pulse,
   wherein the mechanism comprises:
      a plurality of output elements;
      a delay line having a plurality of delay elements corresponding to the output elements to measure the pulse, a number of which correspondingly set the output elements based on the length of the pulse; and,
      a plurality of AND gates between the delay elements and the output elements.

2. The system of claim 1, wherein the mechanism further comprises:
   a logic mechanism to count the number of the plurality of output elements set by the delay line; and,
   the programmable delay line programmed by the logic mechanism based on the number of the plurality of output elements counted to introduce the phase delay into the signal.

3. A system comprising:
   first means for providing a pulse directly proportional to a phase delay for introduction into a signal, such that a longer pulse is to cause a longer phase delay to be introduced into the signal; and,
   second means for introducing the phase delay into the signal based on the pulse such that an output of the second means is not fed back into the second means,
   wherein the second means comprises:
      a plurality of output elements;
      a delay line having a plurality of delay elements corresponding to the output elements to measure the pulse, a number of which correspondingly set the output elements based on the length of the pulse; and,
      a plurality of AND gates between the delay elements and the output elements.

4. The system of claim 3, wherein the second means further comprises:
   a logic mechanism to count the number of the plurality of output elements set; and,
   a programmable delay line programmed by the logic mechanism based on the number of the plurality of output elements counted to introduce the phase delay into the signal.

5. The system of claim 4, wherein each output element comprises:
   a flip-flop.

6. A circuit to introduce a phase delay into a signal comprising:
   a delay line to measure a length of a pulse directly proportional the phase delay, such that a longer pulse is to cause a longer phase delay to be introduced into the signal;
   a plurality of output elements, a number of which are set based on the length of the pulse measured;
   a logic mechanism to count the number of the plurality of output elements set;
   a programmable delay line programmed by the logic mechanism based on the number of the plurality of output elements counted to introduce the phase delay into the signal, the programmable delay line having an output providing the signal with the phase delay such that the output is not fed back into the programmable delay line;
   a plurality of delay elements corresponding to the output elements, a number of which correspondingly set the output elements based on the length of the pulse; and,
   a plurality of AND gates between the delay elements and the output elements.

7. The circuit of claim 6, wherein the plurality of output elements comprises a plurality of flip-flops.

8. A circuit to introduce a phase delay into a signal comprising:
   a plurality of output elements;
   a delay line to set a number of the plurality of output elements in proportional correspondence with a length of a pulse indicative of the phase delay, the delay line having a plurality of delay elements corresponding to the output elements to measure the pulse, a number of which correspondingly set the output elements based on the length of the pulse;
   a logic mechanism to count the number of the plurality of output elements set by the delay line;
   a programmable delay line programmed by the logic mechanism based on the number of the plurality of output elements counted to introduce the phase delay into the signal, the programmable delay line having an output providing the signal with the phase delay such that the output is not fed back into the programmable delay line; and,
   a plurality of AND gates between the delay elements and the output elements.

9. The circuit of claim 8, wherein the plurality of output elements comprises a plurality of flip-flops.

10. A circuit to introduce a phase delay into a signal comprising:
    a plurality of elements, a number of which are set in directly proportional correspondence with a length of a pulse indicative of the phase delay, such that a longer pulse is to cause a greater number of the elements to be set, the length of the pulse being directly proportional to the phase delay to be introduced into the signal, such that a longer pulse is to cause a longer phase delay to be introduced into the signal;

a logic mechanism to count the number of the plurality of elements set, the logic mechanism having a plurality of delay elements corresponding to the elements to measure the pulse, a number of which correspondingly set the elements based on the length of the pulse;

a programmable delay line programmed by the logic mechanism based on the number of the plurality of elements counted to introduce the phase delay into the signal the programmable delay line having an output providing the signal with the phase delay such that the output is not fed back into the programmable delay line; and, a plurality of AND gates between the elements and the delay elements.

11. The circuit of claim 10, wherein the length of the pulse is proportional to the phase delay.

12. The circuit of claim 10, wherein each element comprises:
   a delay element; and,
   a flip-flop.

13. The circuit of claim 12, wherein each element further comprises an AND gate.

14. A circuit to introduce a phase delay into a signal comprising:

a plurality of output elements;

means for setting a number of the plurality of output elements in proportional correspondence with a pulse indicative of the phase delay;

a logic mechanism to count the number of the plurality of output elements set by the means, the logic mechanism having a plurality of delay elements corresponding to the output elements to measure the pulse, a number of which correspondingly set the output elements based on the length of the pulse;

a programmable delay line programmed by the logic mechanism based on the number of the plurality of output elements counted to introduce the phase delay into the signal, the programmable delay line having an output providing the signal with the phase delay such that the output is not fed back into the programmable delay line; and, a plurality of AND gates between the output elements and the delay elements.

* * * * *